United States Patent [19]

Adams et al.

[11] Patent Number: 4,970,099

[45] Date of Patent: Nov. 13, 1990

[54] PERFLUOROPOLYMER COATED PELLICLES

[75] Inventors: Jerome T. Adams, Hockessin; Anestis L. Logothetis, Wilmington, both of Del.

[73] Assignee: E. I. Du Pont de Nemours and Company, Wilmington, Del.

[21] Appl. No.: 354,191

[22] Filed: May 19, 1989

[51] Int. Cl.$^5$ .......................... B32B 1/04; B32B 27/08
[52] U.S. Cl. ................................... 428/76; 428/411.1; 428/412; 428/422; 428/510
[58] Field of Search ............... 428/68, 76, 411.1, 412, 428/422, 510; 525/187, 331; 526/247, 249

[56] References Cited

U.S. PATENT DOCUMENTS

| | | | |
|---|---|---|---|
| 3,351,619 | 11/1967 | Warnell | 526/247 |
| 4,035,565 | 7/1977 | Apotheker et al. | 526/249 |
| 4,243,770 | 1/1981 | Tatemoto et al. | 525/331 |
| 4,281,092 | 7/1981 | Breazeale | 526/247 |
| 4,413,094 | 11/1983 | Aufdermarsh, Jr. | 525/187 |
| 4,487,903 | 12/1984 | Tatemoto et al. | 526/247 |
| 4,529,784 | 7/1985 | Finlay | 526/247 |

Primary Examiner—Thomas J. Herbert
Attorney, Agent, or Firm—Donald W. Huntley

[57] ABSTRACT

Pellicles having films bearing at least one coating of perfluoropolymers as an anti-reflective surface, the perfluoropolymers being copolymerized units of tetrafluoroethylene and perfluro (alkyl vinyl) ether, and further comprising iodo moieties.

12 Claims, 1 Drawing Sheet

PERFLUOROPOLYMER COATED PELLICLES

BACKGROUND OF THE INVENTION

Projection printing systems for forming an image on a light sensitive substrate or wafer are particularly suitable for effecting the exposure of photoresist-coated semiconductor wafers in the manufacture of integrated circuits. These systems normally include a photomask or reticle (hereinafter "mask") having a transparent substrate with a pattern of opaque and transparent areas formed on one surface thereof, an illumination system for directing a beam of radiant energy such as light or ultraviolet rays through the mask to the wafer, optical means for forming a focused image of the mask pattern on the wafer and a pellicle for maintaining the images of any dust particles out of focus on the surface of the mask.

A pellicle is a free-standing thin optical film supported on a frame. Normally, the frame is attached to the mask and the optical film stands away from the mask surface by a given distance. Dust particles, which might otherwise settle on the mask and be projected onto the wafer, will settle on the pellicle instead and be defocused. Consequently, when pellicles are used in a conventional projection printing system, one or more dust particles will not affect the yield of a given wafer and yields can be significantly improved.

Ideally, pellicles should be invisible to the radiant energy of the projection printing system. That is, in order to produce clear, well-defined patterns, the optical film of the pellicle should transmit all of the radiant energy used during the projection printing process, with no reflection.

In the past, single layer pellicles, typically made of nitrocellulose, have been used. With increasing miniaturization, the pattern elements have become smaller and the optical transmission of the pellicle films has become increasingly insufficient. In order to increase the optical transmission of pellicle films, that is, reduce their optical reflectiveness or glare, and thus produce clear, well-defined patterns, multilayer pellicles with various anti-reflective coatings have previously been proposed. Such coatings have included fluoropolymers which provided good optical characteristics. However, continuing effort has been directed to the preparation of anti-reflective coatings which exhibit the best possible combination of optical properties and adhesion to the core materials used for pellicles.

SUMMARY OF THE INVENTION

The present invention provides an improved pellicle having a coating which has excellent optical characteristics and adhesion to the core of the pellicle.

Specifically, the instant invention provides, in a pellicle comprising an optically transparent film which is tautly adhered to the edge of a closed support frame, the film comprising a core layer having an index of refraction of about from 1.35 to 1.80 and a thickness of about from 0.3 to 20 microns, the improvement wherein the film further comprises at least one anti-reflective layer comprising a perfluoropolymer having randomly copolymerized units of tetrafluoroethylene, perfluoro (alkyl vinyl) ether and at least about 0.05 percent, by weight of the perfluoropolymer, of iodo moieties.

DETAILED DESCRIPTION OF THE INVENTION

Figure 1:
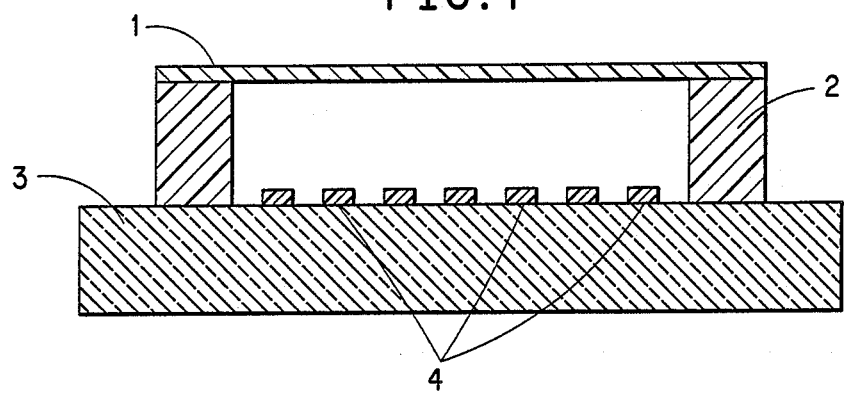
FIG. 1 is a schematic cross-sectional view of a pellicle of the present invention, positioned on a mask.

The pellicles of the present invention include a film having a core layer and at least one perfluoropolymer film on at least one surface of the core.

The core layer of the pellicle film has an index of refraction of about from 1.35 to 1.80 and a thickness of about from 0.3 to 20 microns. Preferably, the core layer has an index of refraction of about 1.51 and a thickness of about from 0.8 to 3.0 microns. Materials known in the art for making uncoated pellicles can be used as the core layer of the invention. These materials are capable of forming a free-standing, isolatable film of substantially uniform thickness having a low level of particulates and low absorption of incident light. A film of this type is considered uniform if the thickness varies by less than about 2 wavelengths of exposure frequency per inch. A "low level of particulates" means the film contains less than 20 visible particles per pellicle and no particles greater than 20 microns. "Low absorption" means that less than about 1% of incident light is absorbed by the film.

Preferably, the core layer comprises a polymer selected from the group consisting of polycarbonates, polyacrylates, polyvinylbutyrates, polyethersulfones, polysulfones, and cellulose derivatives such as cellulose acetate, cellulose acetate butyrate or nitrocellulose. Nitrocellulose films have been found to be particularly satisfactory, and are accordingly preferred.

The central feature of the present invention is a coating, on at least one surface of the core layer, of perfluoropolymer having at least about 0.05 weight percent of iodo moieties. The basic components of the perfluoropolymers, the tetrafluoroethylene (TFE) and the perfluoro (alkyl vinyl) ether, and their polymerization, are described in Harris et al, U.S. Pat. No. 3,132,123, which is hereby incorporated by reference. Of the perfluoro (alkyl vinyl) ethers, perfluoro (methyl vinyl) ether (PMVE) has here found to be particularly satisfactory. Other perfluoro (alkyl vinyl) ethers which can be used in the present invention include perfluoro (alkoxy alkyl vinyl) ethers, such as those described in Fritz et al., U.S. Pat. No. 3,291,843, also hereby incorporated by reference. Of those perfluoro (alkoxy alkyl vinyl) ethers, perfluoro (5-methyl-3,6-dioxa-1-nonene) has been found to be particularly satisfactory.

A wide variety of other monomers can be incorporated into these polymers, including those cyano-substituted perfluorovinyl ethers described in Breazeale, U.S. Pat. No. 4,281,092 and those bromo-substituted monomers described in Apotheker et al., U.S. Pat. No. 4,035,565, both of which are hereby incorporated by reference. The perfluoropolymers used for coating the pellicle core preferably contain such additional monomers, randomly distributed along the backbone of the perfluoropolymer.

A central aspect of the present invention is that the perfluoropolymer comprise iodine moieties. The iodo moieties in the present compositions can be incorporated by conducting the radical copolymerization of the basic monomers noted above in the presence of an iodine-containing compound represented by the formula $RI_x$, where R is a hydrocarbon or saturated fluorocarbon or chlorofluorocarbon residue having 1 to 8 carbon atoms and x is an integer of 1 or 2, corresponding to the valence of the residue R.

In the course of the radically initiated copolymerization, the iodo compound acts as a chain transfer agent, resulting in a telomerization polymerization process in which a labile, iodine-containing chain end is formed, and the residue of the iodo compound is attached to the other end of the polymer chain. If the iodo compound has two iodo groups, the fluoropolymer chain may therefore have iodine groups at each end, and the telomerization polymerization process will occur at each end of the polymer chain.

Iodocompounds which can be used in the preparation of the perfluoropolymer used in the present invention include, for example, those based on hydrocarbon residue such as methylene iodide, 1,4-diiodo butane, and butyl iodide, and those based on saturated fluorocarbon or chlorofluorocarbon residue such as monoiodo perfluoromethane, diiodomethane, monoiodo perfluoroethane, monoiodo perfluoro propane, monoiodopropane, 1,3-diiodoperfluoro-n-propane, 1,4-diiodo-n-butane, 1,4-diiodoperfluoro-n-butane, 1,3-diiodo-2-chloroperfluoro-n-propane and 1,5-diiodo-2,4-dichloro-perfluoro-n-pentane. Other iodo-compounds which can be used include those described in U.S. Pat. No. 4,243,770, hereby incorporated by reference.

The amount of iodo-compound used should be high enough to give extensive chain transfer and result in incorporation of at least about 0.05 weight % of iodine in the perfluoropolymer. High chain transfer efficiency by the alkyl iodide results in a perfluoropolymer with lower compound viscosity and a relatively narrow molecular weight distribution with a typical value of Mw/Mn of about 2-3, for desirable rheology and processing characteristics.

In general, the concentration of iodine in the polymer should be about from 0.05 to 1.0 weight %, and preferably 0.1-0.5 weight %, based on the perfluoropolymer composition. The concentration in the fluoropolymer will depend upon the concentration of alkyl iodides in the polymerization medium and upon polymerization conditions, which will effect the chain transfer efficiency. The upper limit on iodine content corresponds approximately to the practical lower limit on polymer viscosity, since higher concentrations of iodine gives polymers with lower molecular weight and viscosity. The iodine concentration in the perfluoropolymer can be determined by conventional analytical techniques, such as elemental analysis.

The components of the perfluoropolymers used in the coatings are present in the amounts generally used in the preparation of copolymers of tetrafluoroethylene, perfluoro (alkyl vinyl) ether and cure site monomer, as described, for example, in the aforementioned U.S. Pat. Nos. 4,281,092 and 4,035,565. It is particularly preferred that the iodo moieties be present in combination with bromo- or cyano- cure sites randomly positioned along the polymer chain. Concentrations of about from 0.1 to 0.5 weight % bromine, or about from 0.1 to 0.5 weight % cyano groups, have been found to provide particularly good processing characteristics.

The perfluoropolymers used in the present invention can be made by free radical emulsion polymerization in a continuous stirred tank reactor, as described, for example, in the aforementioned U.S. Pat. Nos. 4,281,092 and 4,035,565, and under the general reaction conditions used in the past for the preparation of perfluoropolymers. Specifically, polymerization temperatures can be in the range of about from 40° to 130° C., and preferably about from 70° to 115° C., at pressures of about from 2 to 8 MPa and residence time 10 to 240 minutes. Free radical generation is effected using a water-soluble initiator such as ammonium persulfate, either by thermal decomposition or by reaction with a reducing agent such as sodium sulfite. The alkyl iodides can be fed into the reactor directly or as a solution. Initiator levels are set low enough so that iodine end groups predominate over those from initiator fragments. This leads to the desired low polymer viscosity and high solubility. The polymer dispersion is stabilized with an inert surface-active agent such as ammonium perfluorooctanoate, usually with addition of a base such as sodium hydroxide or a buffer such as disodium phosphate to control pH in the range 3 to 7.

After polymerization, unreacted monomer is removed from the reactor effluent latex by vaporization at reduced pressure. Polymer can be recovered from latex by coagulation, e.g., by reducing pH to about 3 by acid addition and adding a salt solution such as calcium nitrate, magnesium sulfate, or potassium aluminum sulfate in water, followed by separation of serum from polymer, washing with water, and drying of the wet polymer.

A preferred anti-reflective layer of the invention comprises an amorphous polymer of 40–60 weight % TFE, 35–55 weight % perfluoro (methyl vinyl) ether (PMVE) and 0–5 weight % perfluoro-(8-cyano-5-methyl-3,6-dioxa-1-octene) (8-CNVE) modified with about 0.08–0.5 weight % iodo moieties and has an index of refraction of about 1.32.

In accordance with established principles of physics, the optimal thickness of the anti-reflective layer will vary depending on the refractive index of the anti-reflective layer material and the wavelength of energy that will be used. For example, a single transparent layer will reduce surface reflection if the refractive index of the layer is less than that of the substrate to which it is applied and the layer is of appropriate thickness. If the index of refraction of the layer material is exactly equal to the square root of that of the substrate, all surface reflection of light will be eliminated for that wavelength at which the product of refractive index times thickness is equal to one-quarter of the wavelength. At other wavelengths, the destructive interference between light reflected from top and bottom surfaces of the anti-reflection layer is not complete; but, nonetheless, there is a reduction in overall reflectiveness.

The perfluoropolymers can be coated onto one or both sides of the core layer to form the pellicle film. The perfluoropolymers can be applied from a solvent which is incompatible with the underlying layers and which evaporates after application to produce a uniform anti-reflective layer. An incompatible solvent is one which does not dissolve or degrade any underlying layer. Such solvents include fluorocarbons such as those commercially available as Fluorinert ® FC-40 Electronic Liquid, perfluoro trialkyl amines such as those commercially available from 3M Company, St. Paul, Minn. as Fluorinert ® FC-75 Electronic Liquid, perfluoro(2-butyltetrahydrofuran), commercially available from 3M Company, St. Paul, Minn. and fully fluorinated organic compounds with a typical molecular weight range of 300-1000 and commercially available from 3M Company, St. Paul, Minn. as Fluorinert ® FC-77 Electronic Liquid.

The coated pellicle films of the invention can be produced by methods known in the art, e.g. Japanese patent publication Kokai Pat. No. 60-237450.

In a preferred method, the core layer is produced by dissolving a core layer-forming material in a solvent and spin coating the solution onto a glass substrate. A solution suitable for spin coating should wet the substrate, form a uniform coating on the substrate and dry uniformly. After the solution is coated onto the spinning substrate, spinning is stopped and the coating is heated to evaporate solvent and form a uniform core layer. This uniform core layer is isolated from the substrate onto a lifting frame. The lifting frame is mounted onto a spin coater and the anti-reflective coating is formed on the core layer by spin coating a suitable solution of the perflroropolymer. A suitable spin coating solution of the perfluoropolymer is formed by dissolving the amorphous polymer in a solvent which is incompatible with (i.e., will not dissolve or otherwise degrade) the core layer. If an anti-reflective layer is desired on both sides of the core layer, the lifting frame is raised off the spin coater, rotated 180° to expose the opposite side of the core layer, and remounted on the spin coater. The opposite side of the core layer is then coated with the polymer solution in the manner described above.

The optimal thickness of the anti-reflective layer will vary depending on the refractive index of the anti-reflective layer material and the wavelength of energy that will be used. For example, a single transparent layer will reduce surface reflection if the refractive index of the layer is less than that of the substrate to which it is applied and the layer is of appropriate thickness. If the index of refraction of the layer material is exactly equal to the square root of that of the substrate, all surface reflection of light will be eliminated for that wavelength at which the product of refractive index times thickness is equal to one-quarter of the wavelength. At other wavelengths, the destructive interference between light reflected from top and bottom surfaces of the anti-reflection layer is not complete; but, nonetheless, there is a reduction in overall reflectiveness.

The coated core layer and the lifting frame to which it is attached are removed from the spin coater and heated to evaporate solvent. The resulting film is then appropriately adhered to a closed support frame by a suitable adhesive and extends tautly across the support frame, which is smaller than the lifting frame. The side of the support frame opposite the adhered film is secured to a mask surface, the pellicle film suspended above the pattern on the surface of the mask. If only one side of the core layer has an anti-reflective layer thereon, the side lacking the anti-reflective layer is preferably adhered to the support frame. If both sides of the pellicle film have an anti-reflective layer, either side may be adhered to the support frame.

Conventional glues and adhesives can be used to adhere the film to the frame provided the glue or adhesive does not contain a solvent for the core layer. Alternatively, the film can be adhered to the frame by heat press lamination. Preferably, a liquid, UV curable (i.e., curable upon exposure to ultra-violet light) adhesive, is used in this invention, such as that commercially available from Norland Products, Inc. as Norland Optical Adhesive 81.

The closed support frame of the invention can be in any shape and size suitable for attachment to a photo mask or reticle such that the pellicle film does not touch and the frame does not interfere with the work surface of the mask or reticle. Typically, the support frame is circular with a diameter of 1-6 inches, or square with sides of 1-6 inches. The material of the support frame should have high strength, a low tendency to attract dust, and a light weight. Hard plastics, and metals such as aluminum, and aluminum alloys can all be used for the support frame. Aluminum alloys, particularly machined, anodized aluminum, have been found to be particularly satisfactory, and are accordingly preferred.

Figure 2A:
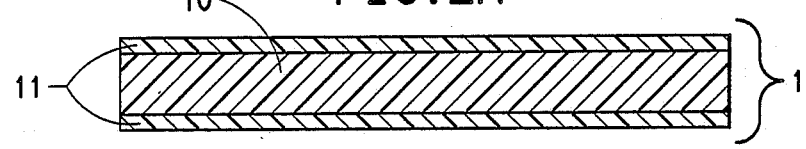
FIGS. 2, 2A and 2B are cross-sectional views of films which can be used in the pellicles of the present invention.
Figure 2B:
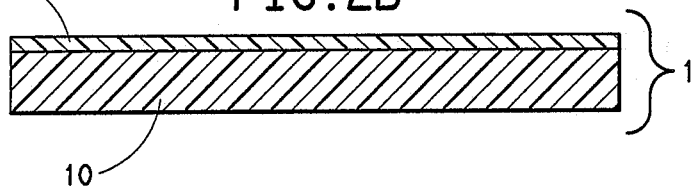
Figure 2C:
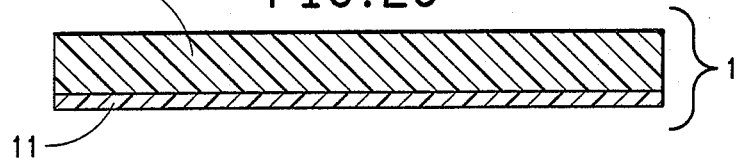

The present invention will be more fully understood by reference to the drawings, in which FIG. 1 illustrates a pellicized mask. The mask 3 is transparent and, typically, composed of silica. A pattern 4 is coated on the upper surface of mask 3. This pattern is encompassed by support frame 2 and covered by pellicle film 1. The pellicle film 1 is shown in greater detail in FIG. 2, and comprises a core layer 10 having an anti-reflective layer 11 on both sides thereof. Other embodiments of the invention are shown in FIGS. 2A and 2B. In FIG. 2A the anti-reflective layer 11 is only on the top side of the core, while in FIG. 2B an anti-reflective layer 11 is on only the bottom side of the core. Radiant energy is projected from a source above the pellicle film through the film, pattern and mask onto a photoresist coated wafer in order to produce integrated circuits.

The amorphous perfluoropolymers used to coat the pellicle films in the present invention exhibit properties which are especially desirable for pellicle anti-reflection layers. Such properties include low absorption and dispersion of light in a broad range of wavelengths, low water absorption to reduce sagging, greater durability to permit repeated exposure, low refractive indices, low surface energies to reduce particulate adhesion and good chemical resistance to solvents and cleaning agents. In addition, these perfluoropolymers exhibit outstanding adhesion to the core films typically used for pellicle construction, and are similarly compatible with adhesives used for pellicle assembly.

Although the foregoing discussion and the following examples are directed primarily to thin optical films having only a core layer and a perfluoropolymer anti-reflective layer on one or both sides thereof, the invention is not so limited. The ordinary artisan will recognize that additional layers such as antistatic layers and cooperating anti-reflective layers, may also be part of the thin optical film of this invention. Conventional methods such as spin-coating may be used to produce these films having additional layers.

In the following examples, the preferred method for making a pellicle film which was described above was used to prepare coated pellicle films.

EXAMPLE 1

A core film was prepared from a nitrocellulose solution (19.2% wt. nitrocellulose wet with 30% wt. n-butanol, dissolved in 81% wt. n-butyl acetate) which was spin coated on a glass substrate and heated to evaporate solvent. The resulting uniform, 2.85 micron thick, nitrocellulose film transmitted about 82% to about 99% of incident light at wavelengths of 300 to 800 nanometers. At wavelengths of 350 to 460 nanometers, the amount of incident light transmitted by this film varied from about 83% to about 98%.

A lifting frame was attached to the nitrocellulose film core by an adhesive and the core was removed from the spin coater substrate. The lifting frame was then mounted onto a spin coater. A perfluoropolmyer was prepared by copolymerization of appropriate monomers to provide a polymer containing copolymerized units based on 55.4 weight % TFE, 43.5 weight % PMVE, 1.1 weight % 8-CNVE and 0.24 weight % iodine. The perfluoropolymer was dissolved in perfluoro trialkyl amines commercially available as Fluorinert ® FC-40 Electronic Liquid from 3M Company, St. Paul, Minn. to provide a 1.5% by weight solution. The solution was filtered through a 0.2 micron syringe disc filter and spin-coated onto the nitrocellulose layer. After the first side of the nitrocellulose layer was coated with the solution, the opposite side of the nitrocellulose layer was coated by rotating the lifting frame 180° and repeating the process. The nitrocellulose layer coated on both sides with the terpolymer was heated to remove solvent. The resulting film transmitted greater than 96% of incident light at wavelengths of 350 to 460 nanometers. Films adhered with the standard optical adhesive withstand normal 30 psi air streams used for testing, impinging the seal at a distance of ¼ inch for thirty seconds.

EXAMPLE 2

The general procedure of Example 1 was repeated, except that the perfluoropolymer contained copolymerized units of 58.4 weight % TFE, 40.0 weight % PMVE and 1.6 weight % terpolymer modified with 0.08 weight % iodine. After the first side of the nitrocellulose layer was coated with the terpolymer solution, the opposite side was coated by rotating the lifting frame 180° and repeating the process. The nitrocellulose layer coated on both sides was heated to remove solvent. The resulting film transmitted greater than 96% of incident light at wavelengths of 360 to 450 nanometers. Films adhered with the standard optical adhesive withstand normal 30 psi air streams used for testing, impinging the seal at a distance of ¼ inch for thirty seconds.

EXAMPLE 3

The general procedure of Example 1 was repeated, except that the perfluoropolymer contained copolymerized units of 56.7 weight % TFE, and 43.3 weight % PMVE and modified with 0.4 weight % iodine. The perfluoropolymer was coated onto a nitrocellulose core as before, and, upon testing, the resulting film transmitted greater than 96% of incident light at wavelengths of 360 to 450 nanometers. Films adhered with the standard optical adhesive withstand normal 30 psi air streams used for testing, impinging the seal at a distance of ¼ inch for thirty seconds.

We claim:

1. A pellicle comprising a thin optical film which is tautly adhered to one edge of a closed support frame, said film comprising a core layer having an index of refraction of about from 1.35 to 1.80 and a thickness of about from 0.3 to about 20 microns, the improvement wherein the film further comprises at least one anti-reflective layer comprising a perfluoropolymer having randomly copolymerized units of tetrafluoroethylene, perfluoro (alkyl vinyl) ether and at least about 0.05 percent, by weight of the perfluoropolymer, of iodo moieties.

2. A pellicle of claim 1 wherein the film comprises a core layer and an anti-reflective layer on one side of the core layer.

3. A pellicle of claim 1 wherein the film comprises a core layer and an anti-reflective layer on both sides of the core layer.

4. A pellicle of claim 1 wherein the iodo moieties are substantially all positioned on the ends of the perfluoropolymer chains.

5. A pellicle of claim 1 wherein the core layer comprises a polymer selected from the group consisting of polycarbonates, polyacrylates, polyvinylbutyrates, polyethersulfones, polysulfones and cellulose derivatives.

6. A pellicle of claim 5 wherein the core layer consists essentially of nitrocellulose.

7. A pellicle of claim 6 wherein the film transmits greater than 96% of incident light in the band of 350 nanometers to 460 nanometers.

8. A pellicle of claim 1 wherein the perfluoropolymer further comprises at least about 0.3%, by weight of the perfluoropolymer, of bromine moieties randomly distributed along the backbone of the perfluoropolymer.

9. A pellicle of claim 8 wherein the bromine moieties comprise about from 0.1 to 0.5% by weight of the perfluoropolymer.

10. A pellicle of claim 1 wherein the perfluoropolymer further comprises at least about 0.1%, by weight of the perfluoropolymer, of cyano moieties randomly distributed along the backbone of the perfluoropolymer.

11. A pellicle of claim 10 wherein the cyano moieties comprise about from 0.1 to 2% by weight of the perfluoropolymer.

12. A pellicle of claim 10 wherein each anti-reflective layer comprises an amorphous terpolymer of the interpolymerized units of about from 40 to 60 weight % TFE, about from 35 to 55 weight % PMVE and up to about 5 weight % 8-CNVE, modified with about from 0.1 to 0.5 weight % iodo moieties.

* * * * *